United States Patent
Mochizuki et al.

(10) Patent No.: US 11,133,149 B2
(45) Date of Patent: Sep. 28, 2021

(54) FOCUSED ION BEAM APPARATUS

(71) Applicant: HITACHI HIGH-TECH SCIENCE CORPORATION, Tokyo (JP)

(72) Inventors: Toshihiro Mochizuki, Tokyo (JP); Haruyuki Ishii, Tokyo (JP); Atsushi Uemoto, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 0 days.

(21) Appl. No.: 17/028,381

(22) Filed: Sep. 22, 2020

(65) Prior Publication Data
US 2021/0090854 A1 Mar. 25, 2021

(30) Foreign Application Priority Data
Sep. 25, 2019 (JP) .............................. JP2019-174086

(51) Int. Cl.
*H01J 37/22* (2006.01)
*H01J 37/20* (2006.01)
*H01J 37/10* (2006.01)

(52) U.S. Cl.
CPC ............ *H01J 37/222* (2013.01); *H01J 37/10* (2013.01); *H01J 37/20* (2013.01); *H01J 2237/049* (2013.01); *H01J 2237/208* (2013.01); *H01J 2237/20207* (2013.01); *H01J 2237/20228* (2013.01); *H01J 2237/216* (2013.01); *H01J 2237/225* (2013.01); *H01J 2237/31745* (2013.01); *H01J 2237/31749* (2013.01)

(58) Field of Classification Search
CPC .......... H01J 37/222; H01J 37/20; H01J 37/10; H01J 37/22; H01J 37/28; H01J 2237/20228; H01J 2237/20207; H01J 2237/31749; H01J 2237/049; H01J 2237/208; H01J 2237/216; H01J 2237/225; H01J 2237/31745
USPC ......................................... 250/309, 306, 307
See application file for complete search history.

(56) References Cited

U.S. PATENT DOCUMENTS

| | | | | |
|---|---|---|---|---|
| 2006/0226359 | A1* | 10/2006 | Principe | G01N 1/32 250/310 |
| 2008/0245965 | A1* | 10/2008 | Sugiyama | H01J 37/3045 250/311 |
| 2008/0265158 | A1* | 10/2008 | Iwasaki | H01J 37/302 250/310 |
| 2013/0001420 | A1* | 1/2013 | Nomaguchi | H01J 37/3056 250/310 |

FOREIGN PATENT DOCUMENTS

JP 2008-270072 A 11/2008

* cited by examiner

*Primary Examiner* — Kiet T Nguyen
(74) *Attorney, Agent, or Firm* — Holland & Hart LLP

(57) ABSTRACT

A focused ion beam apparatus (100) includes: a focused ion beam lens column (20); a sample table (51); a sample stage (50); a memory (6M) configured to store in advance three-dimensional data on the sample table and an irradiation axis of the focused ion beam, the three-dimensional data being associated with stage coordinates of the sample stage; a display (7); and a display controller (6A) configured to cause the display to display a virtual positional relationship between the sample table (51v) and the irradiation axis (20Av) of the focused ion beam, which is exhibited when the sample stage is operated to move the sample table to a predetermined position, based on the three-dimensional data on the sample table and the irradiation axis of the focused ion beam.

9 Claims, 8 Drawing Sheets

FOCUSED ION BEAM APPARATUS

CROSS REFERENCE TO RELATED APPLICATION(S)

This application claims the benefit of Japanese Patent Application No. 2019-174086, filed Sep. 25, 2019, which is hereby incorporated by reference in their entirety into this application.

BACKGROUND OF THE INVENTION

1. Field of the Invention

The present invention relates to a focused ion beam apparatus configured to, for example, process a sample.

2. Description of the Related Art

Hitherto, a focused ion beam apparatus has been used to process and observe a sample.

In addition, there has been developed a technology for determining, by storing three-dimensional data on a focused ion beam lens column and a detector in advance, whether or not, when a sample is moved to a measurement point, those instruments interfere with the sample through simulation based on three-dimensional data on the sample (see Japanese Patent Application Laid-open No. 2008-270072).

Incidentally, when a fine structure, such as a semiconductor device, is processed by irradiating the structure with a focused ion beam, an etching rate varies depending on the shadow of the structure, and hence a processing streak may be caused on the sample due to a curtain effect.

In view of this, for example, a sample stage on which the sample is placed is rotated or tilted on a horizontal plane to obliquely irradiate the structure of the sample with a focused ion beam, to thereby suppress the curtain effect. However, while processing is actually performed through irradiation with the focused ion beam, presence or absence of the curtain effect is observed every time. Therefore, there are cases in which it is difficult to perform processing that appropriately suppresses the curtain effect in some cases, for example, a case in which the sample is tilted excessively to cause a failure in processing and a case in which the tilt of the sample is too small to sufficiently suppress the curtain effect.

SUMMARY OF THE INVENTION

The present invention has been made in view of the above-mentioned circumstances.

A focused ion beam apparatus according to at least one embodiment of the present invention includes: a focused ion beam lens column configured to irradiate a sample with a focused ion beam; a sample table, on which the sample is to be placed; a sample stage, on which the sample table is to be placed, and which is movable in at least a horizontal direction and a height direction; a memory configured to store in advance three-dimensional data on the sample table and an irradiation axis of the focused ion beam, the three-dimensional data being associated with stage coordinates of the sample stage; a display; and a display controller configured to cause the display to display a virtual positional relationship between the sample table and the irradiation axis of the focused ion beam, which is exhibited when the sample stage is operated to move the sample table to a predetermined position, based on the three-dimensional data on the sample table and the irradiation axis of the focused ion beam.

According to the above-mentioned focused ion beam apparatus, the virtual positional relationship between the sample table and the irradiation axis of the focused ion beam is displayed, and hence it is possible to grasp in which direction a beam hits the sample table on which at least the sample is fixed before actual irradiation with the focused ion beam. As a result, it is possible to, for example, determine a degree to which a processing streak is caused due to a curtain effect by the shadow of a structure of the sample, and to, for example, perform appropriate processing by grasping how much the sample is to be tilted to suppress the curtain effect.

In addition, the positional relationship of the irradiation axis of the focused ion beam with the sample table of which the three-dimensional data is known is displayed. Therefore, instead of acquiring the three-dimensional data on the sample that differs in shape or another such factor for each measurement, it is possible to easily display the direction of the focused ion beam with respect to the sample table of which the relative positional relationship with the sample can be roughly grasped, to thereby increase work efficiency.

The focused ion beam apparatus according to at least one embodiment of the present invention may further include a converter configured to convert three-dimensional data on the sample input in advance into the stage coordinates, based on a posture and placement position of the sample after having been placed on the sample table, and in the focused ion beam apparatus, the display controller may be configured to cause the display to display a virtual positional relationship among the sample, the sample table, and the irradiation axis of the focused ion beam, which is exhibited when the sample stage is operated to move the sample to an irradiation position, based on the three-dimensional data on the sample converted by the converter.

According to the above-mentioned focused ion beam apparatus, in addition to the virtual positional relationship of the sample table, the virtual positional relationship of the sample is also displayed in a superimposed manner, and hence it can be grasped with more accuracy in which direction the beam actually hits the sample.

In this case, the virtual positional relationship between the sample and the irradiation axis of the focused ion beam can be displayed, and hence the sample stage may be moved in a virtual manner on a screen so that the sample is located at the irradiation position.

In the focused ion beam apparatus according to at least one embodiment of the present invention, the sample stage may be movable so as to be tilted about a tilt axis parallel to the horizontal direction and perpendicular to the height direction, and the focused ion beam apparatus may further include: an image acquisition unit configured to acquire a planar image of the sample after having been placed on the sample table; and a three-dimensional data generator configured to calculate a movement amount, by which the sample stage is to be moved along a eucentric height, to generate three-dimensional data on the sample. Further, the converter may be configured to convert the three-dimensional data on the sample generated by the three-dimensional data generator into the stage coordinates.

When the three-dimensional data on the sample is known, this known data is only required to be imported, but the shapes of the sample often differ from one another, and it may require a large workload to generate three-dimensional data every time. In view of this, according to the above-mentioned focused ion beam apparatus, when the eucentric height is calculated, a distribution (height profile) of thicknesses of the sample in a planar direction is obtained, and hence the three-dimensional data on the sample can be generated.

In the focused ion beam apparatus according to at least one embodiment of the present invention, the memory may be configured to store one of an etching rate and a deposition rate, which is exhibited when the sample is irradiated with the focused ion beam, and the display controller may be configured to cause the display to display one of a virtual outline of the sample after etching for a predetermined etching time and a virtual outline of the sample after deposition for a predetermined deposition time, based on a virtual positional relationship between the sample and the irradiation axis of the focused ion beam, which is exhibited when the sample stage is operated to move the sample to an irradiation position.

According to the above-mentioned focused ion beam apparatus, one of the virtual outline of the sample after the etching for the predetermined etching time and the virtual outline of the sample after the deposition for the predetermined deposition time is displayed, to thereby be able to grasp the shape of the sample after one of the etching and the deposition.

In regard to, for example, the curtain effect due to the shadow of the structure of the sample after one of the etching and the deposition, it is also to be understood that the virtual positional relationship of the irradiation axis of the focused ion beam can be displayed on the outline. Thus, it is possible to grasp in which direction the beam hits the sample after one of the etching and the deposition.

The focused ion beam apparatus according to at least one embodiment of the present invention may further include one of: a gas ion beam lens column configured to irradiate the sample with a gas ion beam and set to have an acceleration voltage lower than an acceleration voltage of the focused ion beam lens column; and a laser lens column configured to irradiate the sample with a laser beam and set to have an acceleration voltage lower than the acceleration voltage of the focused ion beam lens column, and in the focused ion beam apparatus, the memory may be configured to store in advance three-dimensional data on an irradiation axis of one of the gas ion beam and the laser beam, the three-dimensional data being associated with the stage coordinates of the sample stage, and the display controller may be further configured to cause the display to display a virtual positional relationship among the sample table, the irradiation axis of the focused ion beam, and the irradiation axis of one of the gas ion beam and the laser beam, which is exhibited when the sample stage is operated to move the sample table to a predetermined position, based on the three-dimensional data on the irradiation axis of one of the gas ion beam and the laser beam.

According to the above-mentioned focused ion beam apparatus, it is possible to grasp the direction of the gas ion beam or the laser beam, which is broader than the focused ion beam and has a traveling direction difficult to grasp, and this is useful when, for example, the curtain effect is suppressed with the gas ion beam or the laser beam.

In the focused ion beam apparatus according to at least one embodiment of the present invention, the display controller may be configured to cause the display to display a virtual positional relationship among the sample, the sample table, the irradiation axis of the focused ion beam, and the irradiation axis of one of the gas ion beam and the laser beam, which is exhibited when the sample stage is operated to move the sample to an irradiation position, based on the three-dimensional data on the sample converted by the converter.

According to the above-mentioned focused ion beam apparatus, in regard to, for example, the curtain effect due to the shadow of the structure of the sample after one of the etching and the deposition, the virtual positional relationship of the irradiation axis of the focused ion beam can also be displayed on the outline. Thus, it is possible to grasp in which direction the beam hits the sample after one of the etching and the deposition.

In the focused ion beam apparatus according to at least one embodiment of the present invention, the display controller may be configured to cause the display to display, in a superimposed manner, an irradiation range of the focused ion beam irradiating the sample.

According to the above-mentioned focused ion beam apparatus, it is possible to easily grasp the irradiation range of the focused ion beam irradiating the sample as, for example, a processing frame, and to understand, for example, how the sample is processed with the focused ion beam.

According to at least one embodiment of the present invention, it is possible to obtain the focused ion beam apparatus capable of grasping in which direction a beam hits the sample table on which at least a sample is fixed before actual irradiation with the focused ion beam.

DESCRIPTION OF THE EMBODIMENTS

Now, at least one embodiment of the present invention is described with reference to the accompanying drawings. In the following description, like components are denoted by like reference symbols.

Figure 1:
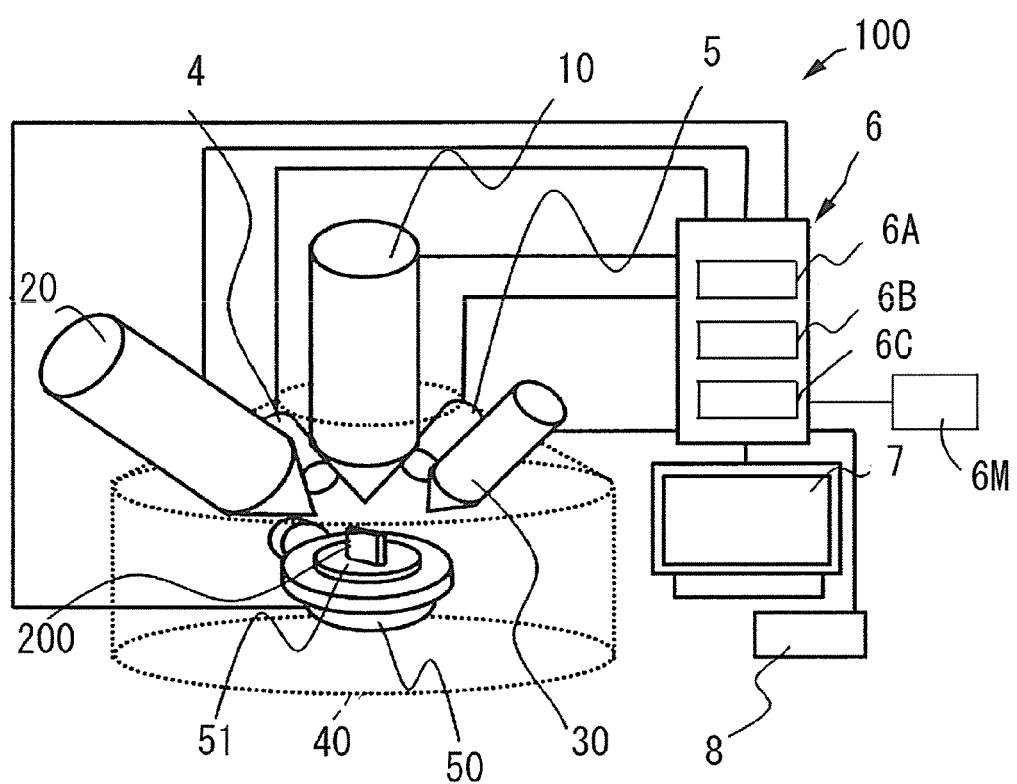
FIG. 1 is a diagram for illustrating an overall configuration of a focused ion beam apparatus according to a first embodiment of the present invention.

FIG. 1 is a block diagram for illustrating an overall configuration of a focused ion beam apparatus 100 according to at least one embodiment of the present invention. In FIG. 1, the focused ion beam apparatus 100 includes an electron beam lens column (SEM lens column) 10, a focused ion beam lens column (FIB lens column) 20, a gas ion beam lens column 30, a secondary electron detector 4, a gas gun 5, a control unit 6, a display 7, an input unit 8, a sample stage 50, and a sample table (sample holder) 51 arranged on the sample stage 50.

In FIG. 1, the FIB lens column 20 and the electron beam lens column 10 may be replaced with each other so as to arrange the FIB lens column 20 vertically.

A part or all of the components of the focused ion beam apparatus 100 are arranged in a vacuum chamber 40, and the inside of the vacuum chamber 40 is depressurized to a predetermined vacuum degree.

The sample stage 50 is configured to movably support the sample table 51, and a sample 200 is placed on the sample table 51. The sample stage 50 also has a moving mechanism capable of displacing the sample table 51 on five axes.

Figure 2:
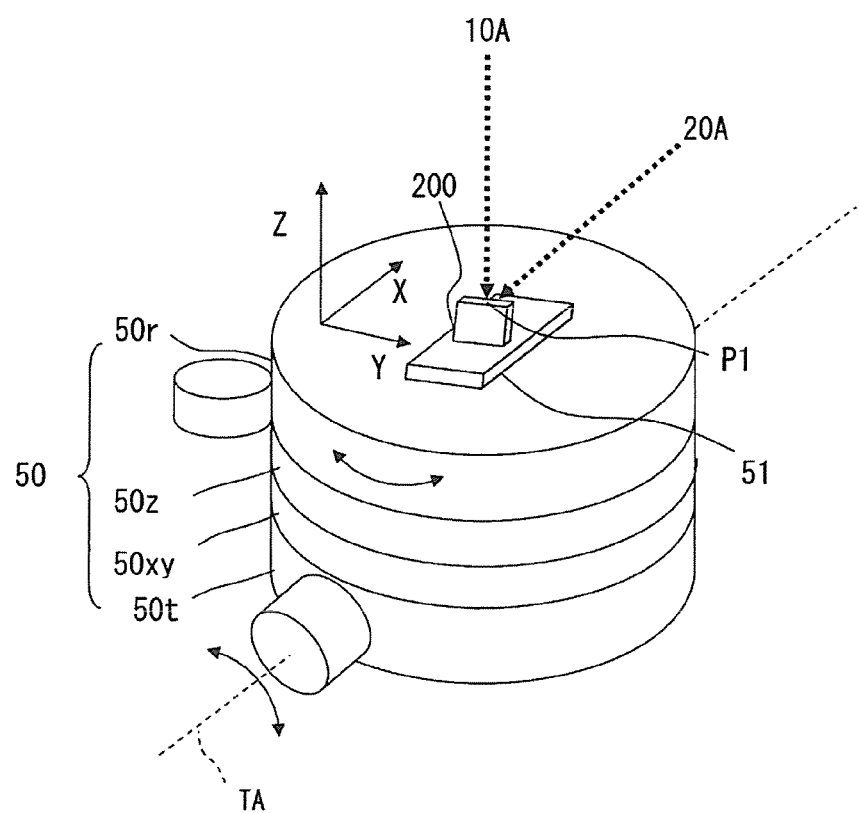
FIG. 2 is an enlarged perspective view of a sample stage.

Specifically, as illustrated in FIG. 2, this moving mechanism includes an XY moving mechanism 50xy for moving the sample table 51 along an X-axis and a Y-axis, which are parallel to a horizontal plane and perpendicular to each other, a Z moving mechanism 50z for moving the sample table 51 along a Z-axis (height direction) perpendicular to the X-axis and the Y-axis, a rotation mechanism 50r for rotating the sample table 51 about the Z-axis, and a tilt mechanism 50t for rotating the sample table 51 about a tilt axis TA parallel to the X-axis. The tilt axis TA is perpendicular to irradiation directions of an electron beam 10A and a focused ion beam 20A.

The above-mentioned moving mechanism can be achieved by a piezoelectric element, a stepping motor, and other various actuators.

The sample stage 50 displaces the sample table 51 on the five axes, to thereby move the sample 200 to an irradiation position (irradiation point P1 at which the irradiation beams 10A to 30A intersect one another, and which is illustrated in FIG. 2).

At the irradiation point P1, the surface (cross section) of the sample 200 is irradiated with the electron beam 10A, the focused ion beam 20A, and the gas ion beam 30A (in FIG. 2, only the electron beam 10A and the focused ion beam 20A are illustrated), to thereby perform processing and SEM observation.

The control unit 6 can be formed of a computer including a CPU serving as a central processing unit, a memory 6M (RAM and ROM) configured to store, for example, data and programs, an input port configured to receive input of a signal from an external apparatus, and an output port configured to output a signal to the external apparatus. The control unit 6 is configured so that the CPU executes various kinds of calculation processing based on the programs stored in the memory 6M to control the respective components of the focused ion beam apparatus 100. Then, the control unit 6 is electrically connected to, for example, control wirings of the electron beam lens column 10, the focused ion beam lens column 20, the gas ion beam lens column 30, the secondary electron detector 4, and the sample stage 50.

The control unit 6 includes a display controller 6A, a converter 6B, and a three-dimensional data generator 6C, which are described later.

The control unit 6 is also configured to drive the sample stage 50 based on a command from software or input performed by an operator to adjust the position and posture of the sample 200, to thereby adjust the irradiation positions and irradiation angles of the electron beam 10A, the focused ion beam 20A, and the gas ion beam 30A for irradiating the surface of the sample 200.

The control unit 6 is connected to the input unit 8, for example, a keyboard, for acquiring an instruction input by the operator, and the display 7 configured to display, for example, an image of a sample.

The SEM lens column 10 includes an electron source (not shown) configured to emit electrons and an electron optical system (not shown) configured to form the electrons emitted from the electron source into a beam shape and to scan the electrons. When the sample 200 is irradiated with the electron beam 10A emitted from the electron beam lens column 10, secondary electrons are generated from the sample 200. The generated secondary electrons are detected by a secondary electron detector (not shown) inside the lens column or the secondary electron detector 4 outside the lens column, to thereby be able to acquire the image of the sample 200. In another case, reflected electrons are detected by a reflected electron detector inside the lens column, to thereby be able to acquire the image of the sample 200.

The electron optical system includes, for example, a condenser lens configured to focus the electron beam 10A, an aperture configured to narrow down the electron beam 10A, an aligner configured to adjust an optical axis of the electron beam 10A, an objective lens configured to focus the electron beam 10A onto the sample 200, and a deflector configured to scan the electron beam 10A on the sample 200.

The secondary electron detector 4 or the reflected electron detector inside the SEM lens column 10 corresponds to an "image acquisition unit" in the appended claims.

The FIB lens column 20 includes an ion source (not shown) configured to generate ions and an ion optical system (not shown) configured to form the ions emitted from the ion source into a beam shape and to scan the ions. When the sample 200 is irradiated with the focused ion beam 20A being a charged particle beam from the FIB lens column 20, secondary ions, secondary electrons, and other such secondary charged particles are generated from the sample 200. Those secondary charged particles are detected by the secondary electron detector 4 to acquire the image of the sample 200. The FIB lens column 20 also increases an irradiation amount of the focused ion beam 20A to perform etching processing (cross-section processing) on the sample 200 within an irradiation range.

The ion optical system has a known configuration, and includes, for example, a condenser lens configured to focus the focused ion beam 20A, an aperture configured to narrow down the focused ion beam 20A, an aligner configured to adjust an optical axis of the focused ion beam 20A, an objective lens configured to focus the focused ion beam 20A on the sample, and a deflector configured to scan the focused ion beam 20A on the sample.

The gas ion beam lens column 30 includes, for example, anion source (not shown) configured to generate argon ions, a condenser lens (not shown) configured to focus the gas ion beam 30A emitted from the ion source, a blanking unit (not shown), an aperture (not shown) configured to narrow down the ion beam, and an objective lens (not shown) configured to focus the ion beam.

The gas ion beam lens column 30 is set to have an acceleration voltage lower than that of the focused ion beam lens column 20, and is used in order to, for example, eliminate a curtain effect (processing streak of the sample) caused due to processing using the focused ion beam.

As the gas ion beam 30A, there is, for example, an ion beam of argon, xenon, or another such rare gas or an ion beam of oxygen.

The same effect is also obtained even through use of a laser lens column in place of the gas ion beam lens column 30, and in this case, the laser beam is applied in place of the gas ion beam 30A.

The gas gun 5 emits a predetermined gas, for example, an etching gas, to the sample 200. The sample 200 is irradiated with the electron beam 10A, the focused ion beam 20A, or the gas ion beam 30A while the etching gas is being supplied from the gas gun 5, to thereby be able to increase an etching speed of the sample through beam irradiation. In another case, the sample 200 is irradiated with the electron beam 10A, the focused ion beam 20A, or the gas ion beam 30A while a compound gas is being supplied from the gas gun 5, to thereby be able to perform local precipitation (deposition) of gas components in the vicinity of abeam irradiation area.

First Embodiment

Figure 3A:
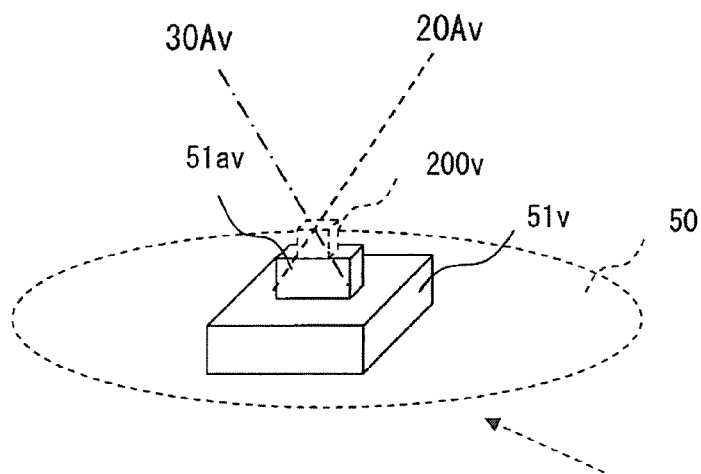
FIG. 3A and FIG. 3B are diagrams for each illustrating a virtual positional relationship among a sample table, an irradiation axis of a focused ion beam, and an irradiation axis of a gas ion beam.
Figure 3B:
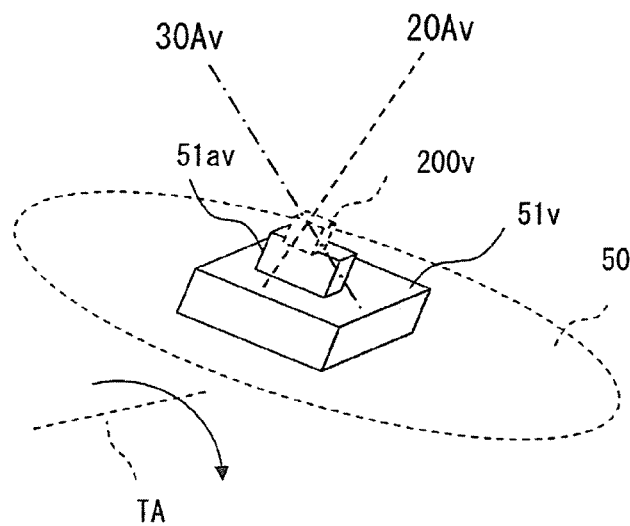

Next, with reference to FIG. 3A and FIG. 3B, displaying processing to be performed by the focused ion beam apparatus 100 according to a first embodiment of the present invention is described.

The memory 6M stores in advance three-dimensional data on the sample table 51, an irradiation axis of the focused ion beam 20A, and an irradiation axis of the gas ion beam 30A, the three-dimensional data being associated with stage coordinates of the sample stage 50.

As illustrated in FIG. 3A, the display controller 6A causes the display 7 to display a virtual positional relationship among a sample table 51v, an irradiation axis 20Av of the focused ion beam 20A, and an irradiation axis 30Av of the gas ion beam 30A, which is exhibited when the sample stage 50 is operated to move the sample table 51 to a predetermined position, based on the three-dimensional data on the sample table 51, the irradiation axis of the focused ion beam 20A, and the irradiation axis of the gas ion beam 30A, which are stored in the memory 6M.

In this case, the word "virtual" indicates that images are generated on a computer from the above-mentioned three-dimensional data instead of images of, for example, the actual sample table 51 and the focused ion beam 20A (for example, images observed by the SEM lens column 10), and a suffix of "v" added to reference symbols indicates being "virtual", as in the sample table 51v and the irradiation axis 20Av. In FIG. 3A, it is assumed that the sample stage 50 has been moved in an XY-direction as indicated by the arrow.

In addition, the wording "move the sample table 51 to a predetermined position" refers to moving the position of the sample table 51 so that, when the sample 200 is placed on the sample table 51, the sample 200 is roughly located at the irradiation position to which the focused ion beam 20A is to be applied. The shape and other such factors of the sample table 51 are known, and the user can roughly grasp a relative positional relationship with the sample 200.

In the first embodiment, the "irradiation position" is set to match a eucentric height Zs described later. An intersection position at which the electron beam 10A, the focused ion beam 20A, and the gas ion beam 30A intersect one another is also set to match the eucentric height Zs. A eucentric height represents a height of the sample stage 50 at which a specific observation point on the sample does not move even when the sample is tilted with the sample being placed on the sample stage.

In addition, when, as illustrated in FIG. 3B, the sample stage 50 is tilted about the tilt axis TA from the position illustrated in FIG. 3A, the positional relationship of the sample table 51v with the irradiation axis 20Av of the focused ion beam 20A and the irradiation axis 30Av of the gas ion beam 30A is changed, and it is possible to grasp a change in how the focused ion beam 20A and the gas ion beam 30A hit the sample table 51.

In this manner, the virtual positional relationship between the sample table 51v and the irradiation axis 20Av of the focused ion beam 20A is displayed, and hence it is possible to grasp in which direction the focused ion beam 20A hits the sample table 51 on which at least a sample is fixed.

As a result, it is possible to, for example, determine a degree to which a processing streak is caused due to the curtain effect by the shadow of the structure of the sample 200, and to, for example, perform appropriate processing by grasping how much the sample is to be tilted to suppress the curtain effect.

In addition, the positional relationship of the irradiation axis of the focused ion beam 20A with the sample table 51 of which the three-dimensional data is known is displayed. Therefore, instead of acquiring three-dimensional data on the sample 200 that differs in shape or another such factor for each measurement, it is possible to easily display the direction of the focused ion beam 20A with respect to the sample table 51 of which the relative positional relationship with the sample 200 can be roughly grasped, to thereby increase work efficiency.

From this point, it is assumed that the three-dimensional shape of the sample table 51 is known and that the sample table 51 is firmly fixed at a predetermined position on the sample stage 50 without unintended movement.

In this example, the virtual positional relationship of the irradiation axis 30Av of the gas ion beam 30A can also be displayed in a superimposed manner, and hence it is also to recognize in which direction the gas ion beam 30A hits the sample table 51.

As a result, it is possible to grasp the direction of the gas ion beam 30A, which is broader than the focused ion beam 20A and has a traveling direction difficult to grasp, and this is useful when, for example, the curtain effect is suppressed with the gas ion beam 30A. The same applies to the laser beam.

It is to be understood that it is not essential to display the irradiation axis 30Av of the gas ion beam 30A, and it suffices to display at least the virtual positional relationship between the sample table 51v and the irradiation axis 20Av of the focused ion beam 20A.

Second Embodiment

Next, with reference to FIG. 3A and FIG. 3B to FIG. 7, displaying processing to be performed by the focused ion beam apparatus 100 according to a second embodiment of the present invention is described.

In the second embodiment, in addition to the virtual positional relationship of the sample table 51v, the virtual positional relationship of a sample 200v indicated by the broken lines of FIG. 3A and FIG. 3B is also displayed in a superimposed manner, and hence it can be grasped with more accuracy in which direction the focused ion beam 20A actually hits the sample 200.

In this case, in the second embodiment, the virtual positional relationship between the sample 200v and the irradiation axis 20Av of the focused ion beam 20A can be displayed, and hence the sample stage 50 may be moved in a virtual manner on the screen so that the sample 200 is located at the irradiation position.

The virtual sample 200v can be displayed after the converter 6B converts the three-dimensional data on the sample input in advance into stage coordinates based on the posture and placement position of the sample 200 after having been placed on the sample table 51.

Now, an example of a method of converting the three-dimensional data on the sample into stage coordinates is described.

First, the user places the actual sample 200 on the sample table 51. Subsequently, in order to obtain "the posture and placement position of the sample 200 after having been placed on the sample table 51", at least three or more points (alignment points) on the surface of the sample 200 are irradiated with the electron beam 10A or the focused ion beam 20A to acquire a piece of data on coordinates of the respective points in a stage coordinate system based on a sample image.

Meanwhile, for example, there is also known in advance a piece of data on coordinates of those respective points in the coordinate system of the three-dimensional data on the sample 200 stored in the memory 6M. Therefore, it is possible to perform conversion processing while correcting a scale by comparing both the pieces of data on the coordinates to each other. The measurement is performed at three or more points, and hence tilt correction can also be performed. As a result, the three-dimensional data on the sample 200 can be linked to the stage coordinate system, and a state in which the sample 200 is actually placed on the sample table 51 can be accurately recognized as the three-dimensional data.

When the three-dimensional data on the sample is known, this known data is only required to be imported, but the shapes of the sample often differ from one another, and it may require a large workload to generate three-dimensional data every time.

Figure 4:
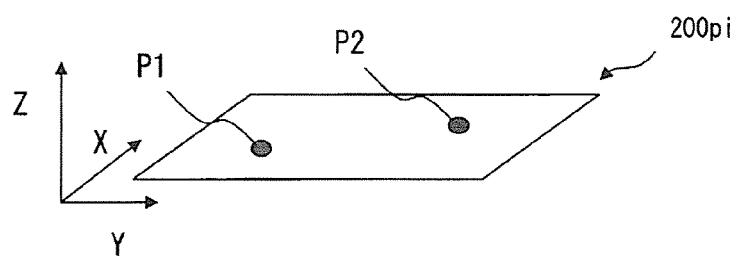
FIG. 4 is a diagram for illustrating an example of a planar image (SEM image) of a sample acquired by an SEM lens column.

In view of this, after the user places actually the sample 200 on the sample table 51, as illustrated in FIG. 4, the electron beam 10A is applied from the SEM lens column 10, and a planar image (SEM image) 200pi of the sample 200 is acquired by the secondary electron detector 4 or the reflected electron detector. The planar image 200pi is an image along an XY-plane. In addition, different irradiation positions (measurement points) P1 and P2 on the surface of the sample 200 are in the planar image 200pi.

Figure 5:
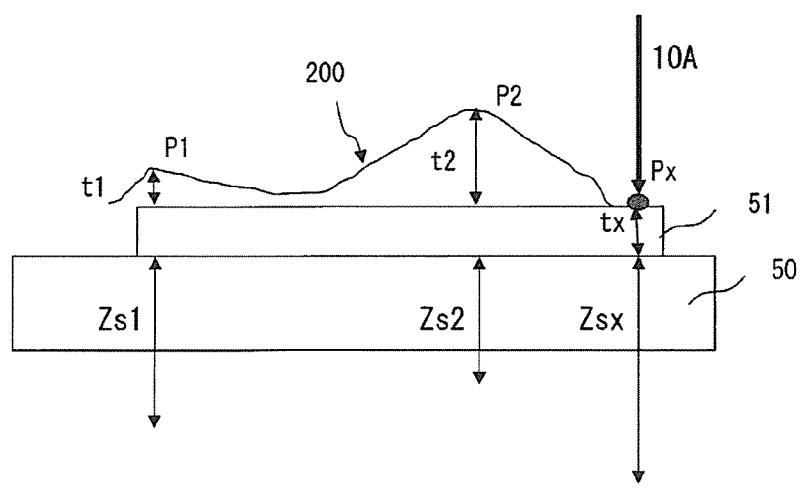
FIG. 5 is a diagram for illustrating a method of calculating a movement amount by which the sample table is to be moved in a height direction so that an irradiation position of the sample matches a eucentric height.

Subsequently, as illustrated in FIG. 5, the three-dimensional data generator 6C calculates a movement amount by which the sample stage 50 is to be moved in a height direction Z so that the irradiation positions P1 and P2 on the sample 200 match eucentric heights Zs1 and Zs2, respectively.

Subsequently, the three-dimensional data generator 6C calculates such a movement amount of the sample stage 50 as to obtain a eucentric height Zsx at a position Px on the surface of the sample table 51 on which the sample 200 is not present.

At this time, when eucentric positions being the heights of the surface of the sample 200 are approximated as being substantially the same, assuming that the sample table 51 has a thickness tx and that thicknesses at P1 and P2 are t1 and t2, respectively, the following equation is obtained.

(Eucentric position at position $P1$)=$Zs1+tx+t1$=$Zsx+tx$

Thus, $t1=Zsx-Zs1$ can be obtained. The same applies to $t2$. Therefore, when the surface of the sample 200 is scanned and the eucentric height Zs is calculated at each of a plurality of irradiation positions, a distribution (height profile) of thicknesses of the sample 200 in the XY-direction is obtained, and hence the three-dimensional data on the sample 200 can be generated.

Figure 6:
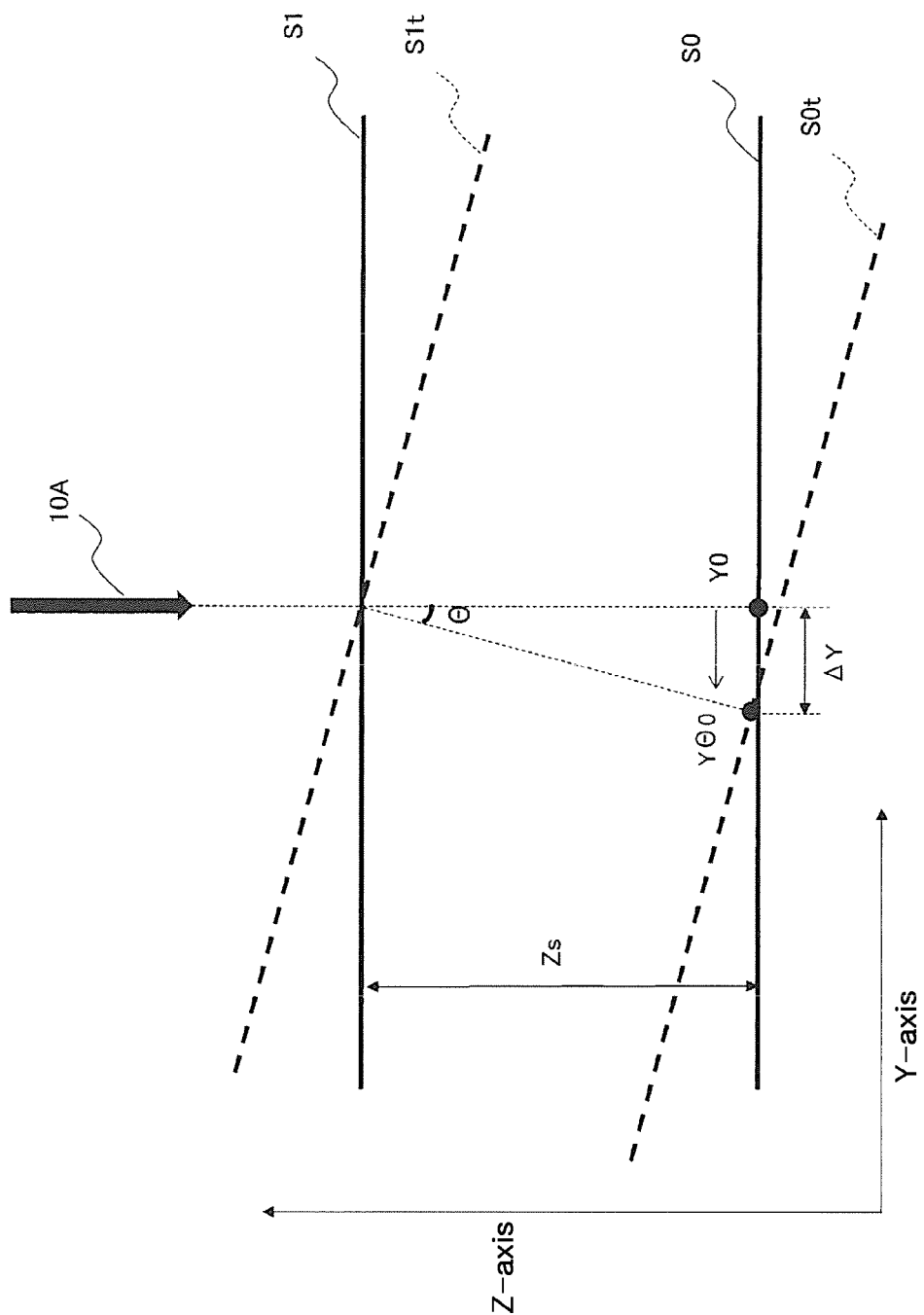
FIG. 6 is a diagram for illustrating an example of a method of calculating a eucentric height $Z_s$ in a second embodiment of the present invention.

Now, with reference to FIG. 6, an example of a method of calculating the eucentric height Zs at each irradiation position P1 is described.

In FIG. 6, first, a sample surface S0 before a tilt is irradiated with the electron beam 10A from a predetermined direction (vertical direction in FIG. 6) to acquire a Y coordinate (Y0) at the irradiation position P1.

Subsequently, the control unit 6 tilts the sample about the tilt axis TA by an angle Θ so that the sample is tilted to have a surface S0t. At this time, the Y coordinate of the irradiation position P1 is moved to YΘ0 by ΔY (moved to the left side in FIG. 6).

The movement amount obtained at this time is approximated by the following expression:

$\Delta Y = Y0 - Y\Theta 0 \approx Zs \times \sin \Theta$  Expression 2:

where Y0, YΘ0, and Θ are known. Therefore, Zs can be obtained by the following expression:

$Zs = (Y0 - Y\Theta 0)/\sin \Theta$  Expression 3:

Expression 2 is recorded in the memory 6M or recorded in a program for calculating the eucentric height Zs to be readout by the control unit 6.

Then, the control unit 6 controls the height of the sample stage 50 so that a sample surface S1 (irradiation position P1) obtained by moving the sample surface S0 in the height direction by +Zs matches the eucentric height Zs.

YΘ0 itself cannot be usually discerned by viewing the SEM image. In view of this, when there is a feature amount (for example, dent or shadow that can be distinguished from the surroundings) at the irradiation position P1 itself, a displacement of the feature amount in the Y-axis direction before and after the tilt may be calculated.

Figure 7:
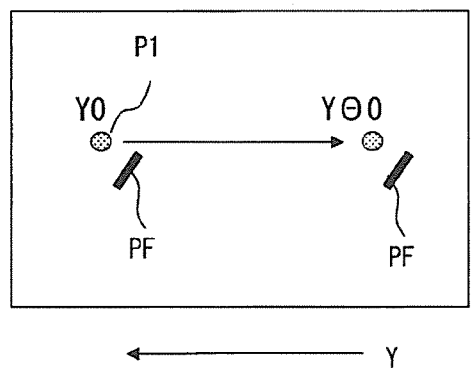
FIG. 7 is a diagram for illustrating irradiation positions before and after a tilt.

Meanwhile, as illustrated in FIG. 7, when there is no feature amount at the irradiation position P1 itself, a displacement of a feature amount PF near the irradiation position P1 in the Y-axis direction before and after the tilt may be calculated.

Third Embodiment

Figure 8:
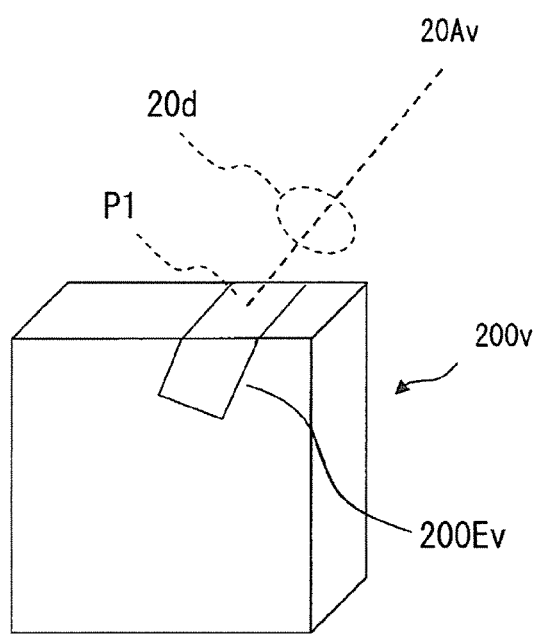
FIG. 8 is a diagram for illustrating a virtual outline of the sample after etching for a predetermined etching time.
Figures 9, 10:
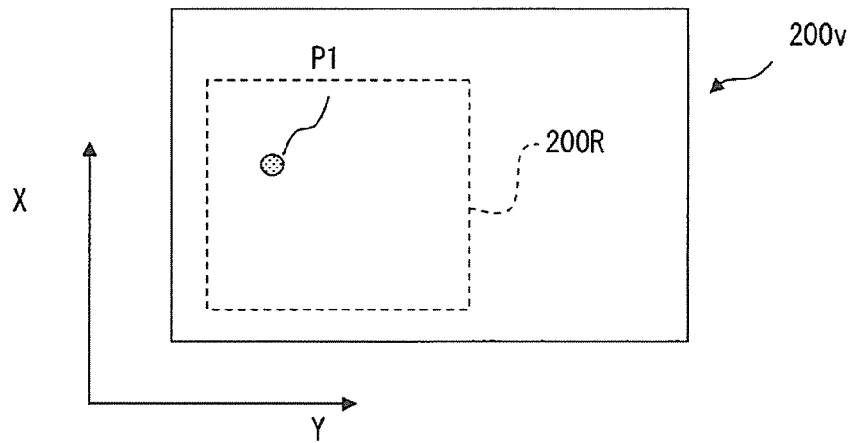
FIG. 9 is a table for showing how an etching rate for each sample is stored in a table.
FIG. 10 is a diagram for illustrating an irradiation range (processing frame) of the focused ion beam irradiating the sample.

Next, with reference to FIG. 8 and FIG. 9, displaying processing to be performed by the focused ion beam apparatus 100 according to a third embodiment of the present invention is described.

In the third embodiment, in addition to the second embodiment, as illustrated in FIG. 8, a virtual outline 200Ev of the sample 200v after having been etched with the focused ion beam 20A for a predetermined etching time is also displayed in a superimposed manner, and hence it is possible to grasp how the sample 200 is actually etched.

At this time, for example, as shown in FIG. 9, the display controller 6A reads out an etching rate per unit time for a sample A of a predetermined type based on a table stored in the memory 6M.

Meanwhile, as illustrated in FIG. 8, for example, a beam diameter 20d for effectively etching at an etching rate shown in FIG. 9 with the irradiation axis 20Av being set as the center is stored in the memory 6M in advance.

Then, the display controller GA reads out the above-mentioned etching rate, and calculates the etching amount for the predetermined etching time based on a direction of the irradiation axis 20Av illustrated in FIG. 8 with respect to the virtual sample 200v and on the irradiation position P1 at which the irradiation axis 20Av hits the surface of the sample 200v.

Then, the display controller 6A calculates the virtual outline 200Ev of the sample 200v after the etching from the etching amount to display the outline 200Ev.

In this manner, the virtual outline 200Ev of the sample 200v after the etching for the predetermined etching time is displayed, to thereby be able to grasp the shape of the sample after the etching.

Figure 12:
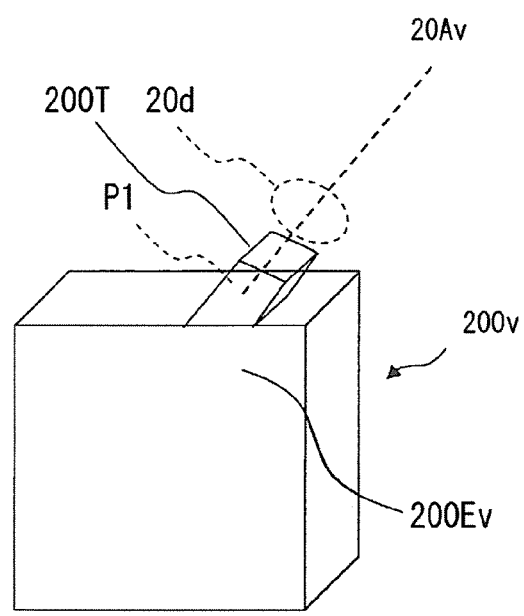
FIG. 12 is a diagram for illustrating a virtual outline of the sample after deposition for a predetermined deposition time.

As illustrated in FIG. 12, as the third embodiment, a virtual outline 200T of the sample 200v obtained when deposition is performed with the focused ion beam 20A in place of the etching may be displayed in a superimposed manner.

When deposition is performed, the etching rate and the etching time are read as a deposition rate and a deposition time, respectively. In addition, a deposition rate per unit time is stored in the table shown in FIG. 9.

In regard to, for example, the curtain effect due to the shadow of the structure of the sample 200 after the etching or after the deposition, it is also to be understood that the virtual positional relationship of the irradiation axis 20Av of the focused ion beam 20A can be displayed on the outline 200Ev or 200T. Thus, it is possible to grasp in which direction the focused ion beam 20A hits the sample 200 after the etching or after the deposition.

It is to be understood that the present invention is not limited to the above-mentioned embodiments, and covers various modifications and equivalents included in the spirit and scope of the present invention.

As illustrated in FIG. 10, the display controller 6A may display an irradiation range (processing frame) 200R of the focused ion beam 20A irradiating the sample 200, on the display 7 in a superimposed manner. With this configuration, it is possible to easily grasp the irradiation range 200R of the focused ion beam 20A irradiating the sample 200v, and to understand, for example, how the sample 200 is processed with the focused ion beam 20A.

Figure 11:
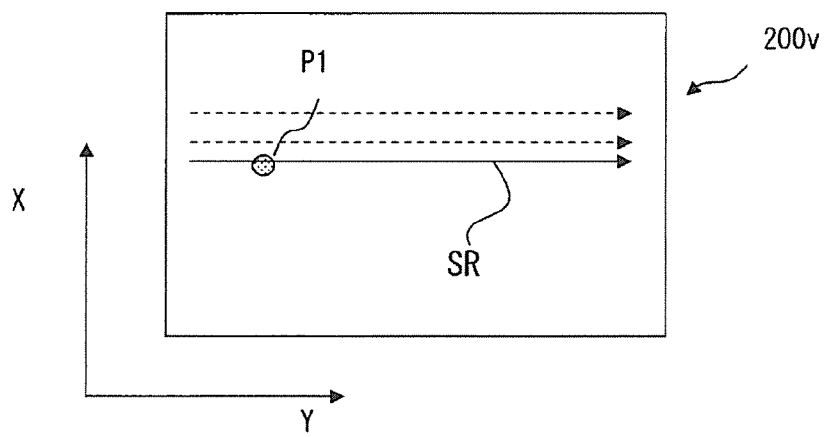
FIG. 11 is a diagram for illustrating how a most recent scanning position is displayed when the focused ion beam and an electron beam are scanned across a surface of the sample.

In another example, as illustrated in FIG. 11, the display controller 6A may display a most recent scanning position SR when the focused ion beam 20A and the electron beam 10A are scanned across the surface of the sample 200. With this configuration, it is possible to easily grasp a position at which the virtual sample 200v is currently being irradiated with each of the focused ion beam 20A and the electron beam 10A.

The focused ion beam apparatus according to at least one embodiment of the present invention is only required to include at least a focused ion beam lens column, and an electron beam lens column and a gas ion beam lens column are not essential components.

Further, the method of calculating a eucentric height is not limited to the above-mentioned method.

The image acquisition unit is not limited to the reflected electron detector inside the electron beam lens column 10 or the secondary electron detector 4, and may be, for example, a detection unit of an optical camera.

What is claimed is:

1. A focused ion beam apparatus, comprising:
    a focused ion beam lens column configured to irradiate a sample with a focused ion beam;
    a sample table, on which the sample is to be placed;
    a sample stage, on which the sample table is to be placed, and which is movable in at least a horizontal direction and a height direction;
    a memory configured to store in advance three-dimensional data on the sample table and an irradiation axis of the focused ion beam, the three-dimensional data being associated with stage coordinates of the sample stage;
    a display; and
    a display controller configured to cause the display to display a virtual positional relationship between the sample table and the irradiation axis of the focused ion beam, which is exhibited when the sample stage is operated to move the sample table to a predetermined position, based on the three-dimensional data on the sample table and the irradiation axis of the focused ion beam.

2. The focused ion beam apparatus according to claim 1, further comprising a converter configured to convert three-dimensional data on a sample input in advance into the stage coordinates, based on a posture and placement position of the sample after having been placed on the sample table,
    wherein the display controller is configured to cause the display to display a virtual positional relationship among the sample, the sample table, and the irradiation axis of the focused ion beam, which is exhibited when the sample stage is operated to move the sample to an irradiation position, based on the three-dimensional data on the sample converted by the converter.

3. The focused ion beam apparatus according to claim 2, wherein the sample stage is movable so as to be tilted about a tilt axis parallel to the horizontal direction and perpendicular to the height direction,
    wherein the focused ion beam apparatus further comprises:
        an image acquisition unit configured to acquire a planar image of the sample after having been placed on the sample table; and
        a three-dimensional data generator configured to calculate a movement amount, by which the sample stage is to be moved along a eucentric height, to generate three-dimensional data on the sample, and
    wherein the converter is configured to convert the three-dimensional data on the sample generated by the three-dimensional data generator into the stage coordinates.

4. The focused ion beam apparatus according to claim 2, wherein the memory is configured to store one of an etching rate and a deposition rate, which is exhibited when the sample is irradiated with the focused ion beam, and
    wherein the display controller is configured to cause the display to display one of a virtual outline of the sample after etching for a predetermined etching time and a virtual outline of the sample after deposition for a predetermined deposition time, based on a virtual positional relationship between the sample and the irradiation axis of the focused ion beam, which is exhibited when the sample stage is operated to move the sample to an irradiation position.

5. The focused ion beam apparatus according to claim 2, wherein the display controller is configured to cause the display to display, in a superimposed manner, an irradiation range of the focused ion beam irradiating the sample.

6. The focused ion beam apparatus according to claim 1, further comprising: a gas ion beam lens column configured to irradiate the sample with a gas ion beam and set to have an acceleration voltage lower than an acceleration voltage of the focused ion beam lens column; and a laser lens column configured to irradiate the sample with a laser beam and set to have an acceleration voltage lower than the acceleration voltage of the focused ion beam lens column, wherein the memory is configured to store in advance three-dimensional data on an irradiation axis of one of the gas ion beam and the laser beam, the three-dimensional data being associated with the stage coordinates of the sample stage, and wherein the display controller is further configured to cause the display to display a virtual positional relationship among the sample table, the irradiation axis of the focused ion beam, and the irradiation axis of one of the gas ion beam and the laser beam, which is exhibited when the sample stage is operated to move the sample table to a predetermined position, based on the three-dimensional data on the irradiation axis of one of the gas ion beam and the laser beam.

7. The focused ion beam apparatus according to claim 6, wherein the display controller is configured to cause the display to display a virtual positional relationship among the sample, the sample table, the irradiation axis of the focused ion beam, and the irradiation axis of one of the gas ion beam and the laser beam, which is exhibited when the sample stage is operated to move the sample to an irradiation position, based on the three-dimensional data on the sample converted by a converter.

8. The focused ion beam apparatus according to claim 1, further comprising: a gas ion beam lens column configured to irradiate the sample with a gas ion beam and set to have an acceleration voltage lower than an acceleration voltage of the focused ion beam lens column; and a laser lens column configured to irradiate the sample with a laser beam and set to have an acceleration voltage lower than the acceleration voltage of the focused ion beam lens column, wherein the memory is configured to store in advance three-dimensional data on an irradiation axis of one of the gas ion beam and the laser beam, the three-dimensional data being associated with the stage coordinates of the sample stage, and wherein the display controller is further configured to cause the display to display a virtual positional relationship among the sample table, the irradiation axis of the focused ion beam, and the irradiation axis of one of the gas ion beam and the laser beam, which is exhibited when the sample stage is operated to move the sample table to a predetermined position, based on the three-dimensional data on the irradiation axis of one of the gas ion beam and the laser beam.

9. The focused ion beam apparatus according to claim 8, wherein the display controller is configured to cause the display to display a virtual positional relationship among the sample, the sample table, the irradiation axis of the focused ion beam, and the irradiation axis of one of the gas ion beam and the laser beam, which is exhibited when the sample stage is operated to move the sample to an irradiation position, based on the three-dimensional data on the sample converted by a converter.

* * * * *